US008611141B2

(12) United States Patent
Baraji et al.

(10) Patent No.: US 8,611,141 B2
(45) Date of Patent: Dec. 17, 2013

(54) MAGNETIC RANDOM ACCESS MEMORY DEVICES INCLUDING HEATING STRAPS

(75) Inventors: Mourad El Baraji, Sunnyvale, CA (US); Neal Berger, Cupertino, CA (US)

(73) Assignee: Crocus Technology Inc., Sunnyvale, CA (US)

( * ) Notice: Subject to any disclaimer, the term of this patent is extended or adjusted under 35 U.S.C. 154(b) by 96 days.

(21) Appl. No.: 13/239,168

(22) Filed: Sep. 21, 2011

(65) Prior Publication Data

US 2013/0070521 A1  Mar. 21, 2013

(51) Int. Cl.
  G11C 11/00  (2006.01)
  G11C 11/14  (2006.01)
(52) U.S. Cl.
  USPC .......................... 365/158; 365/171
(58) Field of Classification Search
  USPC ........................................ 365/158
  See application file for complete search history.

(56) References Cited

U.S. PATENT DOCUMENTS

| | | | |
|---|---|---|---|
| 7,985,963 B2 | 7/2011 | Rinerson et al. | |
| 8,289,765 B2* | 10/2012 | Javerliac et al. | 365/171 |
| 8,385,107 B2* | 2/2013 | Prejbeanu | 365/158 |
| 2002/0089874 A1 | 7/2002 | Nickel et al. | |
| 2006/0215444 A1 | 9/2006 | Perner et al. | |
| 2007/0008793 A1 | 1/2007 | Hirobe | |
| 2008/0160641 A1 | 7/2008 | Min et al. | |
| 2009/0059702 A1 | 3/2009 | Sekiguchi et al. | |
| 2009/0231906 A1 | 9/2009 | Rinerson et al. | |
| 2009/0316476 A1 | 12/2009 | Javerliac et al. | |
| 2010/0110744 A1 | 5/2010 | El Baraji et al. | |
| 2010/0208516 A1 | 8/2010 | Javerliac et al. | |
| 2011/0002151 A1 | 1/2011 | Javerliac et al. | |
| 2011/0110151 A1* | 5/2011 | Prejbeanu | 365/173 |
| 2012/0008383 A1* | 1/2012 | Gapihan et al. | 365/173 |
| 2012/0201073 A1* | 8/2012 | Berger et al. | 365/158 |
| 2012/0314488 A1* | 12/2012 | El Baraji et al. | 365/158 |
| 2013/0070520 A1* | 3/2013 | El Baraji et al. | 365/158 |

OTHER PUBLICATIONS

International Search Report and Written Opinion issued to International Application No. PCT/US12/55995, Nov. 30, 2012, 8 pgs.
Office Action issued to U.S. Appl. No. 13/239,162, Nov. 27, 2012, 8 pgs.
International Search Report and Written Opinion issued to International Patent Application No. PCT/US2012/056000, Nov. 23, 2012, 8 pgs.

* cited by examiner

*Primary Examiner* — Son Mai
(74) *Attorney, Agent, or Firm* — Cooley LLP

(57) ABSTRACT

A memory device includes at least one magnetic random access memory cell, which includes: (1) a magnetic tunnel junction having a first end and a second end; and (2) a strap electrically coupled to the second end of the magnetic tunnel junction. The memory device also includes a bit line electrically coupled to the first end of the magnetic tunnel junction. During a write operation, the bit line is configured to apply a first heating current through the magnetic tunnel junction, and the strap is configured to apply a second heating current through the strap, such that the magnetic tunnel junction is heated to at least a threshold temperature according to the first heating current and the second heating current.

18 Claims, 6 Drawing Sheets

MAGNETIC RANDOM ACCESS MEMORY DEVICES INCLUDING HEATING STRAPS

FIELD OF THE INVENTION

The invention relates generally to magnetic random access memory ("MRAM") devices. More particularly, the invention relates to MRAM devices including heating straps.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which represents an in-between resistance value between that of the high logic state "1" and the low logic state "0".

In a conventional MRAM cell that is implemented for thermally assisted switching ("TAS"), a storage layer is typically exchange biased by an antiferromagnetic layer, which is adjacent to the storage layer within a magnetic tunnel junction and is characterized by a threshold temperature. Below the threshold temperature, a magnetization of the storage layer is pinned by the exchange bias, thereby inhibiting writing of the storage layer. Writing is carried out by passing a current through the magnetic tunnel junction, thereby heating the magnetic tunnel junction above the threshold temperature and unpinning the magnetization of the storage layer. The magnetic tunnel junction is then cooled to below the threshold temperature with a magnetic field applied, such that the magnetization of the storage layer is "frozen" in the written direction.

While offering a number of benefits, a conventional TAS-type MRAM device suffers from certain deficiencies. Specifically, a current that is passed through a magnetic tunnel junction should be of sufficient magnitude to heat the magnetic tunnel junction above a threshold temperature, which can be about 120° C. or higher. However, passing a current of such magnitude through the magnetic tunnel junction can create stresses on an insulating layer within the magnetic tunnel junction, and repeated writing operations can degrade the insulating layer and reduce an operational life of the MRAM device.

It is against this background that a need arose to develop the MRAM devices and related methods described herein.

SUMMARY

One aspect of the invention relates to a memory device. In one embodiment, the memory device includes at least one MRAM cell, which includes: (1) a magnetic tunnel junction having a first end and a second end; and (2) a strap electrically coupled to the second end of the magnetic tunnel junction. The memory device also includes a bit line electrically coupled to the first end of the magnetic tunnel junction. During a write operation, the bit line is configured to apply a first heating current through the magnetic tunnel junction, and the strap is configured to apply a second heating current through the strap, such that the magnetic tunnel junction is heated to at least a threshold temperature according to the first heating current and the second heating current.

Another aspect of the invention relates to a method of operating a memory device. In one embodiment, the method includes providing a magnetic tunnel junction and a strap electrically coupled to the magnetic tunnel junction, where the magnetic tunnel junction has a storage magnetization direction that is pinned relative to a threshold temperature. The method also includes, during a write operation, (1) heating the magnetic tunnel junction to at least the threshold temperature such that the storage magnetization direction is temporarily unpinned, where heating the magnetic tunnel junction includes applying a first heating current through the magnetic tunnel junction and applying a second heating current through the strap; and (2) inducing a write magnetic field such that the storage magnetization direction is aligned according to the write magnetic field.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like features, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, the terms "couple," "coupled," and "coupling" refer to an operational connection or linking. Coupled objects can be directly connected to one another or can be indirectly connected to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

MRAM Devices

Figure 1:
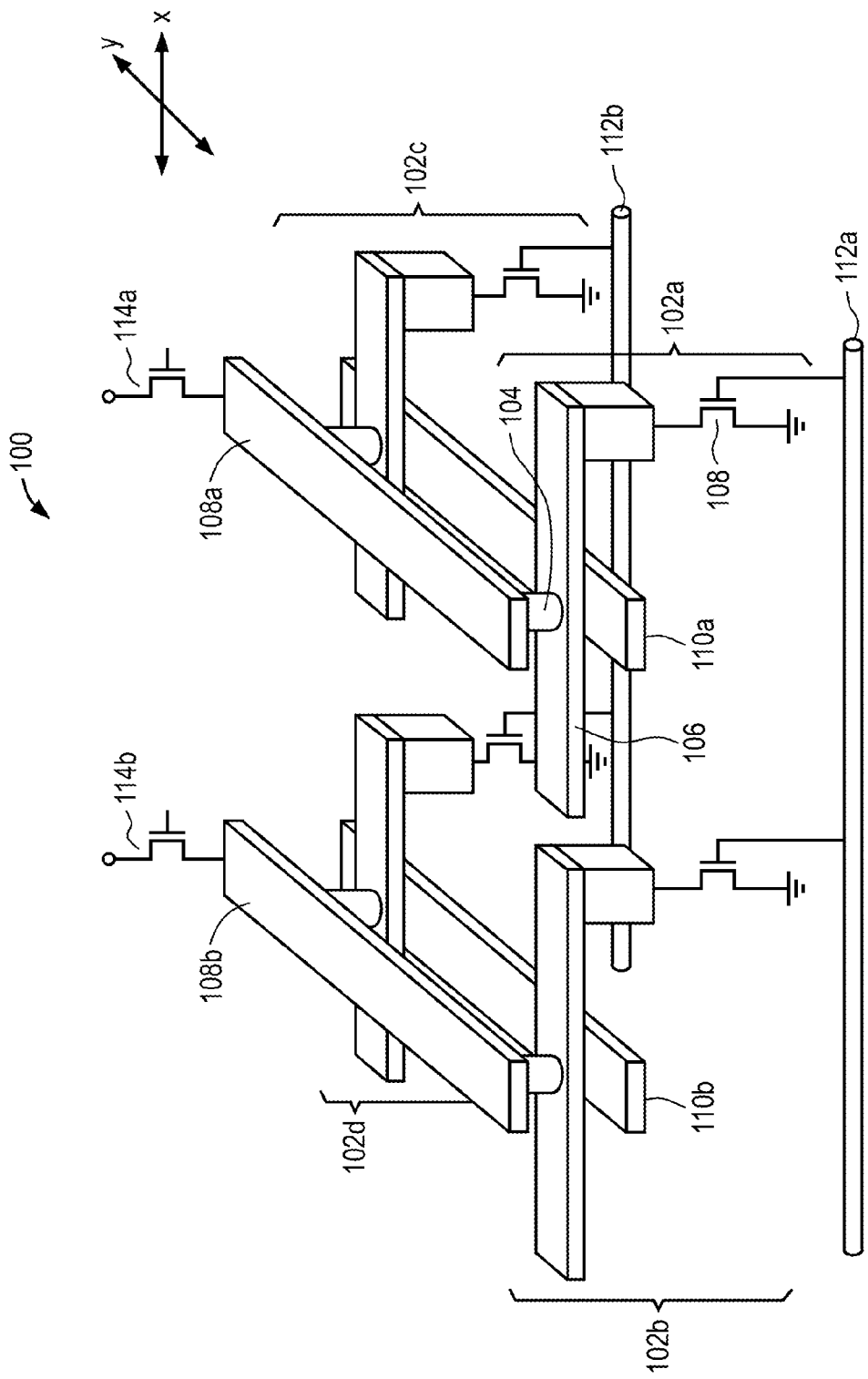
FIG. 1 illustrates a MRAM device implemented in accordance with an embodiment of the invention.

Attention first turns to FIG. 1, which is a perspective view of a memory device implemented in accordance with an embodiment of the invention. In the illustrated embodiment, the memory device is a MRAM device 100 that includes a set of MRAM cells 102a, 102b, 102c, and 102d. Each of the MRAM cells 102a, 102b, 102c, and 102d includes a magnetic tunnel junction, a strap, and a selection transistor, such as a magnetic tunnel junction 104, a strap 106, and a selection transistor 108 included in the MRAM cell 102a. Referring to FIG. 1, the MRAM cells 102a, 102b, 102c, and 102d are arranged in rows and columns along substantially orthogonal directions of a square or rectangular array, although other two-dimensional and three-dimensional arrays are contemplated. Also, while the four MRAM cells 102a, 102b, 102c, and 102d are illustrated in FIG. 1, it is contemplated that more or less MRAM cells can be included in the MRAM device 100.

In the illustrated embodiment, each of the MRAM cells 102a, 102b, 102c, and 102d is implemented for TAS, and, during write operations, the application of currents results in heating that allows one set of magnetizations of the MRAM cells 102a, 102b, 102c, and 102d to be varied, namely storage magnetizations of respective ones of the MRAM cells 102a, 102b, 102c, and 102d. As further explained below, such heating is at least partially achieved through the operation of the straps of the MRAM cells 102a, 102b, 102c, and 102d and, in particular, through the application of currents through the straps to heat the magnetic tunnel junctions that are adjacent to the straps. The implementation of such heating or warming straps allows a reduction in a magnitude of currents passing through the magnetic tunnel junctions during write operations, thereby alleviating stresses on the magnetic tunnel junctions and increasing a durability and operational life of the MRAM device 100.

Referring to FIG. 1, the MRAM device 100 also includes a set of traces or strip conductors to provide write and read functionality. Specifically, a set of field lines 110a and 110b extend across the array of the MRAM cells 102a, 102b, 102c, and 102d in a substantially parallel fashion relative to one another, with the field line 110a magnetically coupled to the MRAM cells 102a and 102c along one column of the array, and with the field line 110b magnetically coupled to the MRAM cells 102b and 102d along another column of the array. During write operations, the application of currents through the field lines 110a and 110b induces magnetic fields that can vary the storage magnetizations of the MRAM cells 102a, 102b, 102c, and 102d. During read operations, the application of currents through the field lines 110a and 110b induces magnetic fields that can vary another set of magnetizations of the MRAM cells 102a, 102b, 102c, and 102d, namely sense magnetizations of respective ones of the MRAM cells 102a, 102b, 102c, and 102d.

The MRAM device 100 also includes a set of bit lines 108a and 108b, which extend across the array in a substantially parallel fashion relative to one another and in a substantially parallel fashion relative to the field lines 110a and 110b. Specifically, the bit line 108a is electrically coupled to the MRAM cells 102a and 102c along one column of the array, and the bit line 108b is electrically coupled to the MRAM cells 102b and 102d along another column of the array. During write operations, the application of currents through the bit lines 108a and 108b and through the magnetic tunnel junctions of the MRAM cells 102a, 102b, 102c, and 102d results in partial heating, which, as combined with additional, partial heating by the straps of the MRAM cells 102a, 102b, 102c, and 102d, allows the storage magnetizations to be varied. During read operations, the application of currents through the bit lines 108a and 108b and through the magnetic tunnel junctions allows the determination of resistance values, which are indicative of a degree of alignment between the storage magnetizations and the sense magnetizations of the MRAM cells 102a, 102b, 102c, and 102d. As illustrated in FIG. 1, the bit lines 108a and 108b are electrically coupled to selection transistors 114a and 114b, respectively, which allow selection of the bit lines 108a and 108b during write and read operations.

Still referring to FIG. 1, the MRAM device 100 further includes a set of control lines 112a and 112b, which are electrically coupled to the MRAM cells 102a, 102b, 102c, and 102d through their selection transistors. Specifically, the control line 112a is electrically coupled to the selection transistors of the MRAM cells 102a and 102b along one row of the array, and the control line 112b is electrically coupled to the selection transistors of the MRAM cells 102c and 102d along another row of the array. During write and read operations, the control lines 112a and 112b switch the selection transistors of the MRAM cells 102a, 102b, 102c, and 102d between a blocked mode (OFF) and a saturated mode (ON). Likewise, the selection transistors 114a and 114b are switched between a blocked mode and a saturated mode. Coordinated operation of the field lines 110a and 110b, the bit lines 108a and 108b, and the control lines 112a and 112b allows a particular subset of the MRAM cells 102a, 102b, 102c, and 102d to be selectively addressed during write and read operations. For example, when the MRAM cell 102a is to be written, the bit line 108a can be activated by switching the selection transistor 114a to a saturated mode, the field line 110a can be activated, and the control line 112a also can be activated to switch the selection transistor 108 to a saturated mode, thereby inducing a magnetic field in the vicinity of the MRAM cell 102a and allowing current flow through the magnetic tunnel junction 104 and through the strap 106 of the MRAM cell 102a. In such manner, the MRAM cell 102a, which is disposed at an intersection of the field line 110a, the bit line 108a, and the control line 112a, can be individually addressed.

Other implementations of the field lines 110a and 110b, the bit lines 108a and 108b, and the control lines 112a and 112b are contemplated. Specifically, the orientation and the number of these traces can be varied from that illustrated in FIG. 1. For example, the field lines 110a and 110b can be combined into a common field line that is magnetically coupled to, and shared by, the MRAM cells 102a and 102c and the MRAM cells 102b and 102d in different columns. As another example, the field lines 110a and 110b can be disposed above the bit lines 108a and 108b, rather than below the bit lines 108a and 108b as illustrated in FIG. 1. As a further example, the application of currents through the straps can be used to induce magnetic fields to vary the magnetizations of the MRAM cells 102a, 102b, 102c, and 102d during write and read operations. In other words, the straps also can function as a set of field lines, such that the field lines 110a and 110b can be omitted. The implementation of such active, heating straps conserves valuable die area and lowers manufacturing costs. Also, because of the close spacing of such active, heating straps relative to the magnetic tunnel junctions of the MRAM cells 102a, 102b, 102c, and 102d, switching efficiency of induced magnetic fields can be improved, thereby allowing low-intensity magnetic fields and reduced power consumption.

Figure 2A:
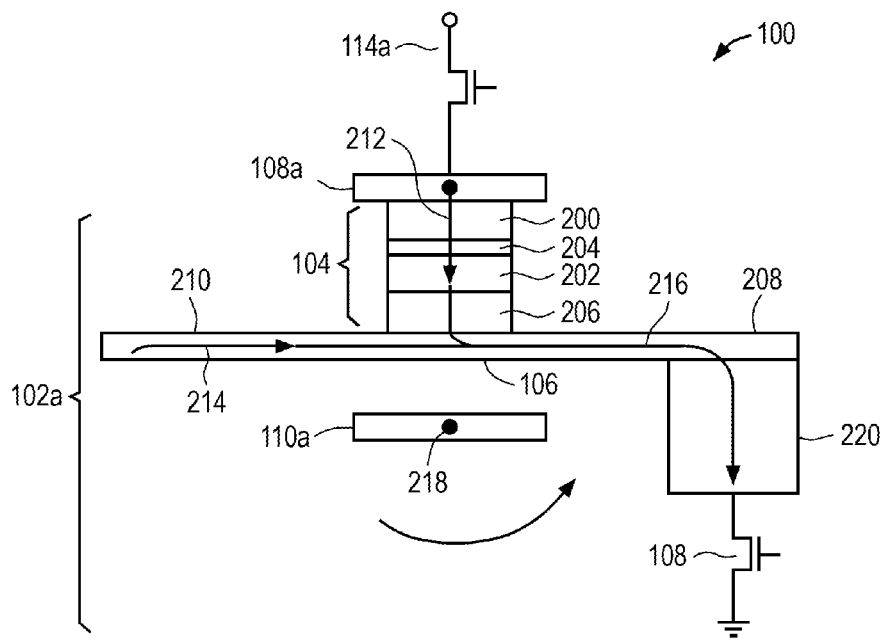
FIG. 2A and FIG. 2B illustrate a MRAM cell included in the MRAM device of FIG. 1, according to an embodiment of the invention.
Figure 2B:
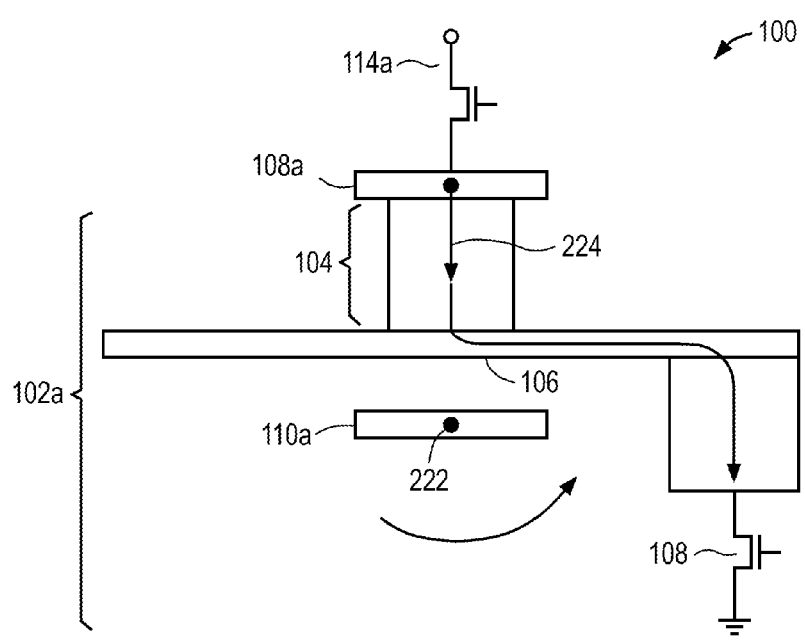

Attention next turns to FIG. 2A and FIG. 2B, which are enlarged views of the MRAM cell 102a that is included in the MRAM device 100 of FIG. 1, according to an embodiment of the invention. Referring to FIG. 2A, the MRAM cell 102a includes the magnetic tunnel junction 104, which includes a pair of magnetic layers corresponding to a sense layer 200 and a storage layer 202. The magnetic tunnel junction 104 also includes a spacer layer 204 that is disposed between the sense layer 200 and the storage layer 202. As illustrated in FIG. 2A, the bit line 108a is electrically coupled to a top end of the magnetic tunnel junction 104 on the side of the sense layer 200 and is substantially parallel to the field line 110a, which is disposed below and magnetically coupled to a bottom end of the magnetic tunnel junction 104 on the side of the storage layer 202. The MRAM cell 102a also includes the selection transistor 108, which is electrically coupled, through the strap 106, to the magnetic tunnel junction 104 on the side of the storage layer 202. Other implementations of the MRAM cell 102a are contemplated. For example, the relative positioning of the sense layer 200 and the storage layer 202 can be reversed in the magnetic tunnel junction 104, with the storage layer 202 disposed above the sense layer 200.

Each of the sense layer 200 and the storage layer 202 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 200 and the storage layer 202 can include the same ferromagnetic material or different ferromagnetic materials. As illustrated in FIG. 2A, the sense layer 200 includes a soft ferromagnetic material, namely one having a relatively low coercivity, such as no greater than about 0.01 oersted, while the storage layer 202 includes a hard ferromagnetic material, namely one having a relatively high coercivity, such as greater than about 0.01 oersted. In such manner, a magnetization of the sense layer 200 can be readily varied under low-intensity magnetic fields during read operations, while a magnetization of the storage layer 202 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 200 and the storage layer 202 can be in the nanometer ("nm") range, such as from about 1 nm to about 20 nm or from about 1 nm to about 10 nm. Other implementations of the sense layer 200 and the storage layer 202 are contemplated. For example, either, or both, of the sense layer 200 and the storage layer 202 can include multiple sub-layers in a fashion similar to that of the so-called synthetic antiferromagnetic layer.

The spacer layer 204 functions as a tunnel barrier and includes, or is formed of, an insulating material. Suitable insulating materials include oxides, such as aluminum oxide (e.g., $Al_2O_3$) and magnesium oxide (e.g., MgO). A thickness of the spacer layer 204 can be in the nm range, such as from about 1 nm to about 10 nm.

Referring to FIG. 2A, the MRAM cell 102a is implemented as a single-bit cell that stores a binary data value. In accordance with the single-bit implementation of the MRAM cell 102a, the storage layer 202 has a storage magnetization direction that is switchable between a pair of distinct directions according to a write encoding scheme, such as in which one direction is assigned to a high logic state "1", and a substantially opposite direction is assigned to a low logic state "0". As illustrated in FIG. 2A, the magnetic tunnel junction 104 includes a pinning layer 206, which is disposed adjacent to the storage layer 202 and is characterized by a threshold temperature $T_{BS}$ that can correspond to a blocking temperature, a Neel temperature, or another threshold temperature. Through exchange bias, the pinning layer 206 stabilizes the storage magnetization along an initial direction when a temperature within, or in the vicinity of, the pinning layer 206 is lower than the threshold temperature $T_{BS}$. The pinning layer 206 unpins, or decouples, the storage magnetization when the temperature is at, or above, the threshold temperature $T_{BS}$, thereby allowing the storage magnetization to be switched to another direction. In contrast, such a pinning layer is omitted adjacent to the sense layer 200, and, as a result, the sense layer 200 has a sense magnetization direction that is unpinned and is readily varied, with the substantial absence of exchange bias.

The pinning layer 206 includes, or is formed of, a magnetic material and, in particular, a magnetic material of the antiferromagnetic type. Suitable antiferromagnetic materials include transition metals and their alloys, including alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the threshold temperature $T_{BS}$ of alloys based on Ir and Mn (or based on Fe and Mn) can be in the range of about 120° C. to about 220° C. or about 150° C. to about 200° C., and can be smaller than the threshold temperature $T_{BS}$ of alloys based on Pt and Mn (or based on Ni and Mn), which can be in the range of about 300° C. to about 350° C. Because the sense magnetization direction is unpinned, the threshold temperature $T_{BS}$ can be selected to accommodate a desired application, such as a high temperature application, in the absence of, or without regard to, another threshold temperature that would otherwise set an upper bound of an operating temperature window.

Still referring to FIG. 2A, the strap 106 is implemented as a heating strap, and includes a set of strap portions, namely strap portions 208 and 210. The bottom end of the magnetic tunnel junction 104 is electrically coupled to the strap 106 between the strap portions 208 and 210, with the strap portion 208 extending laterally away from the magnetic tunnel junction 104 along one direction and electrically coupling the bottom end of the magnetic tunnel junction 104 to the selection transistor 108 through a contact stud 220. The strap portion 210 extends laterally away from the magnetic tunnel junction 104 in a substantially opposite direction, and, although not illustrated in FIG. 2A, the strap portion 210 can be electrically coupled to a current or voltage source. Other implementations of the strap 106 are contemplated, and, in particular, the orientation and the number of the strap portions 208 and 210 can be varied from that illustrated in FIG. 2A. Also, although not illustrated in FIG. 2A, a cladding can be included adjacent to an exterior of the strap 106 to attenuate undesired magnetic fields induced by current flow through the strap 106. Such a cladding can be omitted or reconfigured for other implementations, such as those including active, heating straps.

During a TAS-type write operation of the MRAM cell 102a as illustrated in FIG. 2A, the magnetic tunnel junction 104 is heated by the combined effect of a pair of contributions. Specifically, one contribution involves Joule heating and heating from tunneling electrons, and is carried out by applying a heating current 212 through the magnetic tunnel junction 104 via the bit line 108a, with the selection transistors 108 and 114a in their saturated modes. Another contribution involves Joule heating, and is carried out by applying another heating current 214 through the strap 106 and between the strap portions 208 and 210, with the selection transistor 108 remaining in its saturated mode. As illustrated in FIG. 2A, the heating currents 212 and 214 merge to form a combined heating current 216 that passes through the strap portion 208 and the selection transistor 108. As a result of this pair of heating contributions, the magnetic tunnel junction 104 is heated to a temperature at, or above, the threshold temperature $T_{BS}$, such that the storage magnetization direction is unpinned. Simultaneously or after a short time delay, the field line 110a is activated to induce a write magnetic field to switch the storage magnetization direction from an initial direction to another direction. Specifically, a write current 218 is applied through the field line 110a to induce the write magnetic field to switch the storage magnetization direction accordingly.

By providing at least partial heating through the strap 106, the illustrated embodiment achieves the desired heating relative to the threshold temperature $T_{BS}$, while reducing a magnitude of the heating current 212 passing through the magnetic tunnel junction 104 to alleviate stresses on the magnetic tunnel junction 104. The heating contribution from the strap 106 can be increased or otherwise adjusted by suitable selection and control over a resistivity of the strap portions 208 and 210. For example, the resistivity of the strap portions 208 and 210 can be increased by reducing a cross-sectional area of the strap portions 208 and 210, such as by reducing their thickness, reducing their width, or both. For certain implementations, the cross-sectional area of the strap portions 208 and 210 can be no greater than about $3\times10^{-11}$ cm$^2$, such as no greater than about $2\times10^{-11}$ cm$^2$ or no greater than about $1\times10^{-11}$ cm$^2$, and down to about $1\times10^{-12}$ cm$^2$ or less, resulting in a sheet resistance that is at least about 150 Ω/square, such as at least about 200 Ω/square or at least about 250 Ω/square, and up to about 500 Ω/square or more. As another example, the resistivity of the strap portions 208 and 210 can be increased by adjusting a cross-sectional shape of the strap portions 208 and 210, such as from a square shape to a relatively thin, rectangular shape. As a further example, the resistivity of the strap portions 208 and 210 can be increased through the use of resistive materials having a sheet resistance that is at least about 150 Ω/square, such as at least about 200 Ω/square or at least about 250 Ω/square, and up to about 500 Ω/square or more. For certain implementations, either, or both, of the strap portions 208 and 210 can include, or can be formed of, tantalum nitride having a sheet resistance of about 223 Ω/square, although other highly resistive materials are also suitable.

Optimizing the relative heating contributions from the strap 106 and from passing the heating current 212 through the magnetic tunnel junction 104 can involve balancing countervailing factors related to alleviating stresses on the spacer layer 204, power consumption, and heating efficiency. For example, although certain implementations can achieve heating solely through operation of the strap 106, a power consumption and a magnitude of the heating current 214 to achieve a desired level of heating can be greater than other implementations in which the strap 106 provides partial heating. In terms of providing partial heating, the heating current 214 can have a magnitude sufficient to heat the magnetic tunnel junction 104 to a temperature of at least about $0.5\times T_{BS}$, such as at least about $0.6\times T_{BS}$ or at least about $0.7\times T_{BS}$, but less than $T_{BS}$, such as up to about $0.9\times T_{BS}$ or up to about $0.95\times T_{BS}$, with the heating current 212 providing additional, partial heating to heat the magnetic tunnel junction 104 to at least $T_{BS}$. Also, in terms of providing partial heating, the magnitude of the heating current 214 can be at least about 50 percent of a magnitude of the combined heating current 216, such as at least about 60 percent or at least about 70 percent, but less than 100 percent of the magnitude of the combined heating current 216, such as up to about 90 percent or up to about 95 percent.

Once the storage magnetization direction is switched to a written direction, the selection transistors 108 and 114a are switched to their blocked modes to inhibit current flow through the magnetic tunnel junction 104 and through the strap 106, thereby cooling the magnetic tunnel junction 104. The write magnetic field can be maintained during cooling of the magnetic tunnel junction 104, and can be deactivated once the magnetic tunnel junction 104 has cooled below the threshold temperature $T_{BS}$. Because the storage magnetization direction is pinned by the exchange bias of the pinning layer 206, its orientation remains stable so as to retain the written data.

During a read operation of the MRAM cell 102a as illustrated in FIG. 2B, the field line 110a is activated to induce a read magnetic field to vary the sense magnetization direction of the sense layer 200. Specifically, a read current 222 is applied through the field line 110a to induce the read magnetic field to vary the sense magnetization direction accordingly. Because the sense layer 200 is subject to little or no exchange bias, the sense magnetization direction can be readily varied under low-intensity magnetic fields and at a temperature below the threshold temperature $T_{BS}$, while the storage magnetization direction remains stable in the written direction. For certain implementations, the read operation of the MRAM cell 102a is carried out in multiple read cycles, in which the field line 110a is activated in a fashion that is compatible with a write encoding scheme. Because the sense magnetization direction can be aligned according to the read magnetic field, the sense magnetization direction can be successively switched between a pair of distinct directions according to the write encoding scheme.

As part of each read cycle, a degree of alignment between the storage magnetization direction and the sense magnetization direction is determined by applying a sense current 224 through the magnetic tunnel junction 104 via the bit line 108a, with the selection transistors 108 and 114a in their saturated modes. Measuring a resulting voltage across the magnetic tunnel junction 104 when the sense current 224 is applied yields a resistance value of the magnetic tunnel junction 104 for a particular read cycle and for a particular direction of the write encoding scheme. Alternatively, a resistance value can be determined by applying a voltage across the magnetic tunnel junction 104 and measuring a resulting current. When the respective magnetizations of the sense layer 200 and the storage layer 202 are antiparallel, a resistance value of the magnetic tunnel junction 104 typically corresponds to a maximum value, and, when the respective magnetizations are parallel, a resistance value of the magnetic tunnel junction 104 typically corresponds to a minimum value. When the respective magnetizations are between antiparallel and parallel, a resistance value of the magnetic tunnel junction 104 is typically between the maximum value and the minimum value. Resistance values for multiple read cycles are processed to determine which direction yielded a minimum resistance value, thereby yielding a stored data value based on which one of a pair of logic states is assigned to that direction. Processing of the resistance values can be carried out using a suitable controller in combination with, for example, a sample/hold circuit.

The read operation of the MRAM cell 102a explained above is self-referenced, since it can be carried out based on the relative alignment of magnetizations within the MRAM cell 102a, without requiring a comparison to a reference resistance value of a reference cell or a group of reference cells. The self-referenced implementation of the MRAM cell 102a allows the omission of a reference layer with a fixed magnetization and, therefore, allows the operation of the MRAM cell 102a in the absence of, or without regard to, an upper threshold temperature. In such manner, an operation temperature window of the MRAM cell 102a can be greatly expanded, such as to temperatures up to about 400° C. or more.

Figure 3:
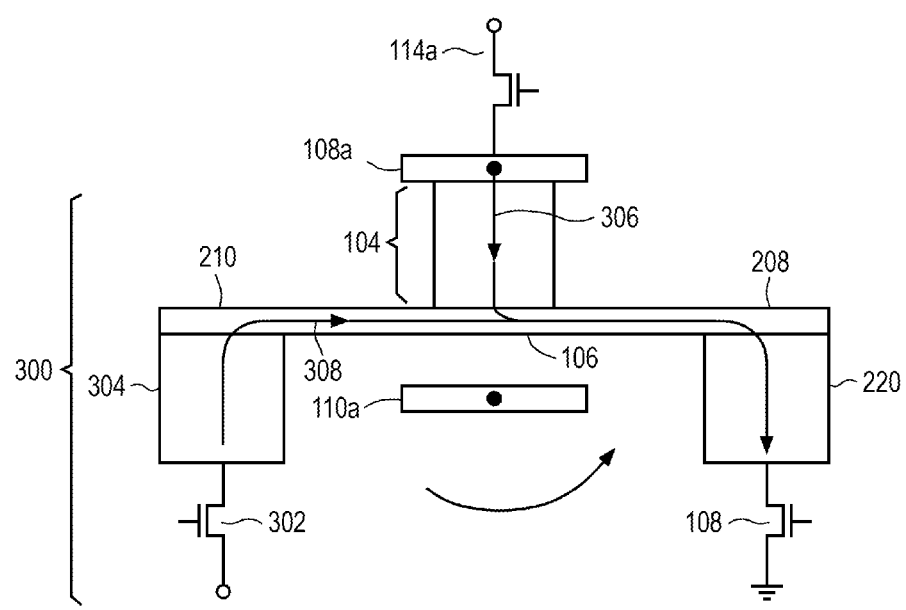
FIG. 3 illustrates a MRAM cell implemented in accordance with another embodiment of the invention.

FIG. 3 is an enlarged view of a MRAM cell 300 that is implemented in accordance with another embodiment of the invention. Certain aspects of the MRAM cell 300 can be implemented in a similar fashion as previously explained for the MRAM cell 102a of FIG. 2A and FIG. 2B, and those aspects are not repeated below.

Referring to FIG. 3, the strap 106 includes the strap portions 208 and 210, with the strap portion 208 electrically coupling the bottom end of the magnetic tunnel junction 104 to the selection transistor 108 through the contact stud 220, and with the strap portion 210 electrically coupling the bottom end of the magnetic tunnel junction 104 to another selection transistor 302 through a contact stud 304. The inclusion of the pair of selection transistors 108 and 302 provides greater control over current flow through the strap 106. During a TAS-type write operation of the MRAM cell 300 as illustrated in FIG. 3, the magnetic tunnel junction 104 is partially heated by applying a heating current 306 through the magnetic tunnel junction 104 via the bit line 108a, with the selection transistors 108 and 114a in their saturated modes. In combination, another heating current 308 is applied through the strap 106 and between the strap portions 208 and 210, with the selection transistors 108 and 302 in their saturated modes. As a result, the magnetic tunnel junction 104 is heated to a temperature at, or above, the threshold temperature $T_{BS}$, such that the storage magnetization direction is unpinned. Simultaneously or after a short time delay, the field line 110a is activated to induce a write magnetic field to switch the storage magnetization direction accordingly. A read operation of the MRAM cell 300 can be carried out in a similar fashion as previously explained for the MRAM cell 102a of FIG. 2A and FIG. 2B.

Figure 4A:
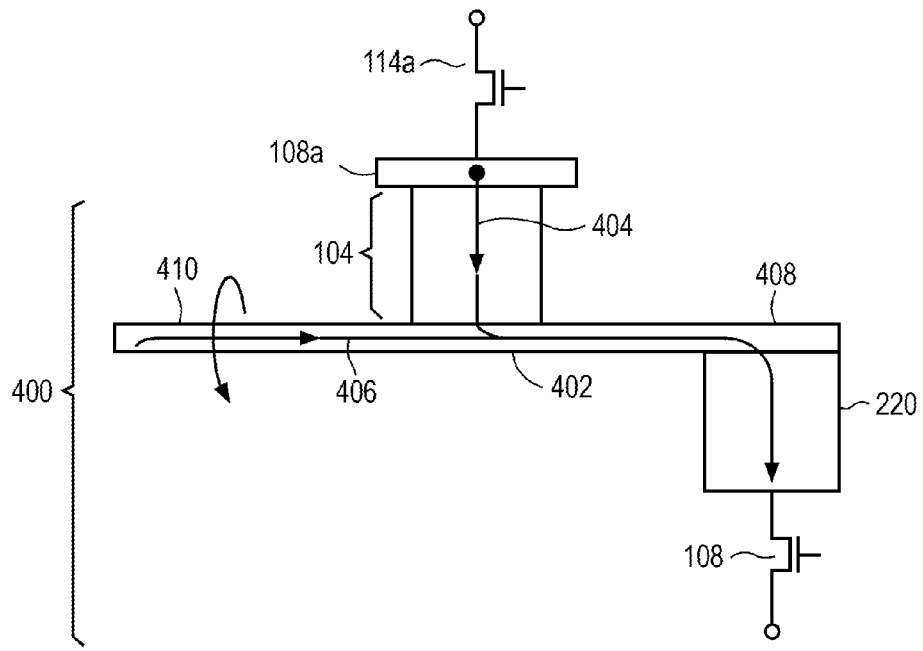
FIG. 4A and FIG. 4B illustrate a MRAM cell implemented in accordance with another embodiment of the invention.
Figure 4B:
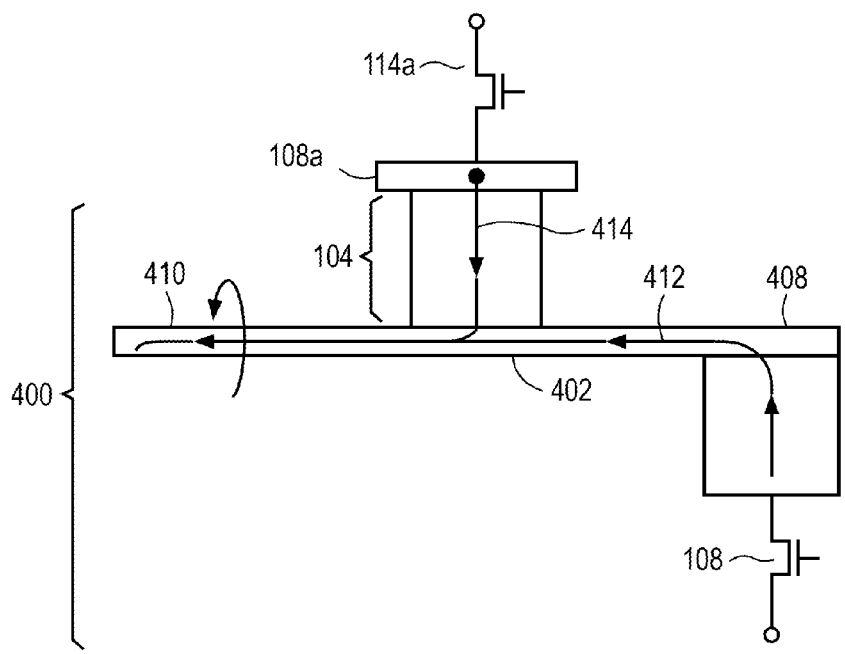

FIG. 4A and FIG. 4B are enlarged views of a MRAM cell 400 that is implemented in accordance with another embodiment of the invention. Certain aspects of the MRAM cell 400 can be implemented in a similar fashion as previously explained for the MRAM cell 102a of FIG. 2A and FIG. 2B, and those aspects are not repeated below.

The MRAM cell 400 includes a strap 402, which is implemented as an active, heating strap to provide current flow to heat the magnetic tunnel junction 104 during write operations, as well as to provide current flow to induce magnetic fields during write and read operations. During a TAS-type write operation of the MRAM cell 400 as illustrated in FIG. 4A, the magnetic tunnel junction 104 is partially heated by applying a heating current 404 through the magnetic tunnel junction 104 via the bit line 108a, with the selection transistors 108 and 114a in their saturated modes. In combination, another heating current 406 is applied through the strap 402 and between strap portions 408 and 410, with the selection transistor 108 remaining in its saturated mode. As a result, the magnetic tunnel junction 104 is heated to a temperature at, or above, the threshold temperature $T_{BS}$, such that the storage magnetization direction is unpinned and is switched according to a write magnetic field induced by current flow through the strap 402. Simultaneously or after a short time delay, the current flow through the strap 402 is reduced or throttled down to a level sufficient to allow cooling of the magnetic tunnel junction 104 while maintaining the write magnetic field during such cooling. The current flow through the magnetic tunnel junction 104 can be deactivated once the desired level of heating is achieved, or can be maintained for some period of time subsequent to achieving the desired level of heating.

In the illustrated embodiment, current flow through the strap 402 is bidirectional so as to allow a direction of an induced magnetic field to be reversed. Such bidirectionality can be achieved by, for example, reversing a voltage polarity between the strap portions 408 and 410. For example, and referring to a read cycle of the MRAM cell 400 as illustrated in FIG. 4B, a read current 412 is applied so as to pass from the strap portion 408 towards the strap portion 410, thereby inducing a read magnetic field having a particular direction to vary the sense magnetization direction accordingly. In combination, a sense current 414 is applied through the magnetic tunnel junction 104 via the bit line 108a, thereby yielding a resistance value of the magnetic tunnel junction 104 for the read cycle. During another read cycle, a direction of the read current 412 is reversed so as to pass from the strap portion 410 towards the strap portion 408, thereby reversing the direction of the read magnetic field. In such fashion, the sense magnetization direction can be successively switched between a pair of distinct directions.

Figure 5:
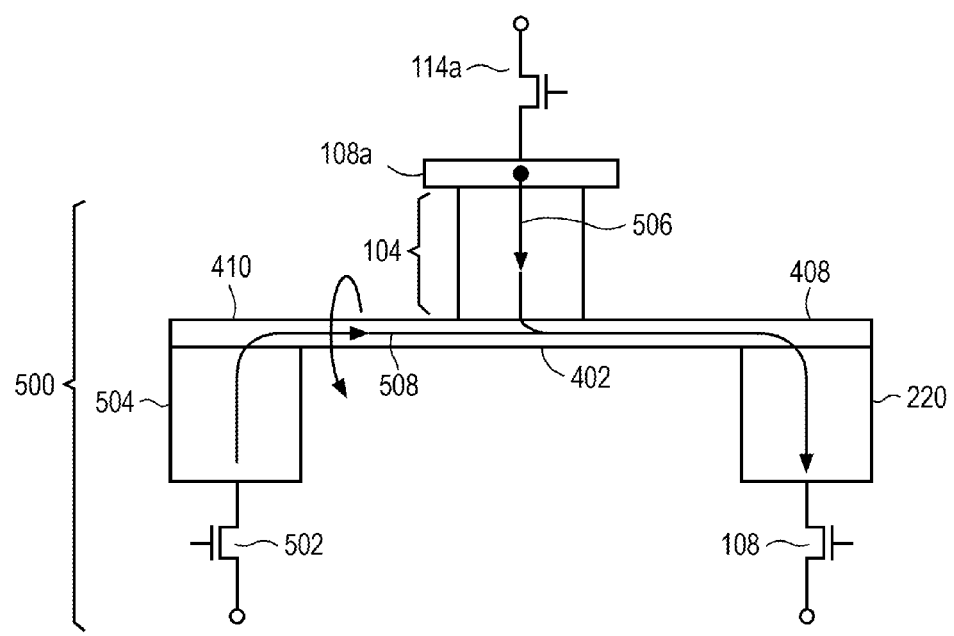
FIG. 5 illustrates a MRAM cell implemented in accordance with another embodiment of the invention.

FIG. 5 is an enlarged view of a MRAM cell 500 that is implemented in accordance with another embodiment of the invention. Certain aspects of the MRAM cell 500 can be implemented in a similar fashion as previously explained for the MRAM cell 102a of FIG. 2A and FIG. 2B and the MRAM cell 400 of FIG. 4A and FIG. 4B, and those aspects are not repeated below.

Referring to FIG. 5, the strap 402 includes the strap portions 408 and 410, with the strap portion 408 electrically coupling the bottom end of the magnetic tunnel junction 104 to the selection transistor 108 through the contact stud 220, and with the strap portion 410 electrically coupling the bottom end of the magnetic tunnel junction 104 to another selection transistor 502 through a contact stud 504. The inclusion of the pair of selection transistors 108 and 502 provides greater control over current flow through the strap 402. During a TAS-type write operation of the MRAM cell 500 as illustrated in FIG. 5, the magnetic tunnel junction 104 is partially heated by applying a heating current 506 through the magnetic tunnel junction 104 via the bit line 108a, with the selection transistors 108 and 114a in their saturated modes. In combination, another heating current 508 is applied through the strap 402 and between the strap portions 408 and 410, with the selection transistors 108 and 502 in their saturated modes. As a result, the magnetic tunnel junction 104 is heated to a temperature at, or above, the threshold temperature $T_{BS}$, such that the storage magnetization direction is unpinned and is switched according to a write magnetic field induced by current flow through the strap 402. Simultaneously or after a short time delay, the current flow through the strap 402 is reduced or throttled down to a level sufficient to allow cooling of the magnetic tunnel junction 104 while maintaining the write magnetic field during such cooling. A read operation of the MRAM cell 500 can be carried out in a similar fashion as previously explained for the MRAM cell 400 of FIG. 4A and FIG. 4B.

It should be understood that the embodiments explained above are provided by way of example, and other embodiments are contemplated. For example, and referring to FIG. 2A, a reference layer can be substituted in place of the sense layer 200, and a reference magnetization can be stabilized along a substantially fixed direction by another pinning layer, which can be disposed adjacent to the reference layer and can be characterized by an upper threshold temperature $T_{BR} > T_{BS}$.

Figure 6:
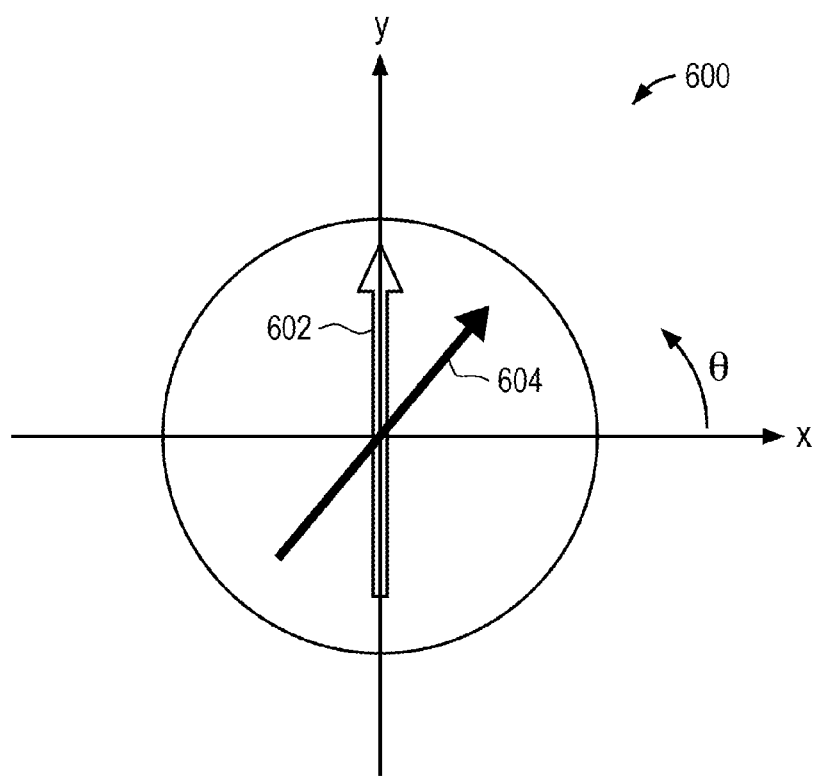
FIG. 6 illustrates a multi-bit MRAM cell implemented in accordance with a further embodiment of the invention.

As another example, a TAS-type implementation of a MRAM cell can be further extended by including functionality to write and read multiple bits per cell, such as by using magnetizations that can be rotated in two dimensions. FIG. 6 illustrates such a MRAM cell 600, according to a further embodiment of the invention. Specifically, the MRAM cell 600 is implemented to store data corresponding to m logic states, with m>2. In other words, the MRAM cell 600 is a multi-bit cell that stores a multi-bit data value. Referring to FIG. 6, the MRAM cell 600 has a storage magnetization 602 that is switchable between m directions (and between m angles) corresponding to the m logic states, according to a set of bits to be stored. In addition, the MRAM cell 600 has a sense magnetization 604 that is switchable between the m directions (and between the m angles) corresponding to the m logic states. The stored set of bits can be determined based on a relative alignment between the storage magnetization 602 and the sense magnetization 604.

For certain implementations, m can be represented as $m=2^n$, with $n \geq 2$. Here, the MRAM cell 600 is an n-bit cell that stores an n-bit data value. One possible write encoding scheme assigning m logic states to m distinct angles θ is set forth in Table 1 below. A particular encoding scheme can be selected based on an angular resolution that allows alignment and misalignment of magnetizations to be distinguished. For example, if a resolution of resistance values is 90°, one possible encoding scheme assigning four logic states to four distinct angles θ is set forth in Table 2 below. As additional examples, a 45° resolution can be implemented with an encoding scheme with m=8 and n=3, a 22.5° resolution can be implemented with an encoding scheme with m=16 and n=4, and so forth. It should be understood that other encoding schemes are contemplated. For example, and referring to Table 2, the assignment between m logic states and m angles θ can be permuted, such that the logic state "00" is assigned to 90° (instead of 0°), the logic state "01" is assigned to 0° (instead of 90°), and so forth. As another example, an offset can be added to some, or all, of the angles θ, such that the logic state "00" is assigned to 0°+offset, the logic state "01" is assigned to 90°+offset, and so forth. As further examples, an increment between successive angles θ can be variable, rather than a constant, and certain of the m logic states and certain of the m angles θ can be omitted.

TABLE 1

| Logic State/ n-bit data | θ |
| --- | --- |
| 0 ... 00 | 0° |
| 0 ... 01 | $360°/2^n$ |
| 0 ... 10 | $2(360°/2^n)$ |
| 0 ... 11 | $3(360°/2^n)$ |
| ... | ... |

TABLE 2

| Logic State/ 2-bit data | θ |
| --- | --- |
| 00 | 0° |
| 01 | 90° |
| 10 | 180° |
| 11 | 270° |

The multi-bit MRAM cell 600 of FIG. 6 can be implemented in a similar fashion as that shown in FIG. 2A, and including another field line that is disposed above the bit line 108a and that is substantially orthogonal to the field line 110a. During a write operation, at least one of the field line 110a and the other field line is activated to induce a set of magnetic fields to switch the storage magnetization 602 to a particular one of the m directions. Likewise, during a read operation, at least one of the field line 110a and the other field line is activated to induce a set of magnetic fields to successively switch the sense magnetization 604 between the m directions. Other implementations of a multi-bit MRAM cell are contemplated. For example, and referring to FIG. 2A, the strap 106 can be implemented as an active, heating strap, and can function as the other field line.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A memory device comprising:
at least one magnetic random access memory (MRAM) cell including a magnetic tunnel junction having a first end and a second end; and
a strap electrically coupled to the second end of the magnetic tunnel junction; and
a bit line electrically coupled to the first end of the magnetic tunnel junction,
wherein, during a write operation, the bit line is configured to apply a first heating current through the magnetic tunnel junction, and the strap is configured to apply a second heating current through the strap, such that the magnetic tunnel junction is heated to at least a threshold temperature according to the first heating current and the second heating current; and
wherein the threshold temperature corresponds to $T_{BS}$, and the second heating current has a magnitude sufficient to heat the magnetic tunnel junction to at least $0.6 \times T_{BS}$ but less than $T_{BS}$.

2. The memory device of claim 1, wherein a sheet resistance of the strap is at least 200 Ω/square.

3. The memory device of claim 1, wherein a cross-sectional area of the strap is no greater than $3 \times 10^{-11}$ cm$^2$.

4. The memory device of claim 1, wherein the magnitude of the second heating current is sufficient to heat the magnetic tunnel junction to at least $0.7 \times T_{BS}$ but less than $T_{BS}$.

5. The memory device of claim 1, wherein the first heating current and the second heating current merge to form a combined heating current that passes through at least a portion of the strap.

6. The memory device of claim 1, wherein the strap includes a first strap portion and a second strap portion that extends from the first strap portion, the second end of the magnetic tunnel junction is electrically coupled to the strap between the first strap portion and the second strap portion, and the strap is configured to apply the second heating current between the first strap portion and the second strap portion.

7. The memory device of claim 6, wherein the MRAM cell further includes a first selection transistor, and the first strap portion electrically couples the second end of the magnetic tunnel junction to the first selection transistor.

8. The memory device of claim 7, wherein the MRAM cell further includes a second selection transistor, and the second strap portion electrically couples the second end of the magnetic tunnel junction to the second selection transistor.

9. The memory device of claim 1, further comprising a field line magnetically coupled to the magnetic tunnel junction, wherein the magnetic tunnel junction has a storage magnetization direction, and, during the write operation, the field line is configured to apply a write current through the field line to induce a write magnetic field, such that the storage magnetization direction is switched according to the write magnetic field.

10. The memory device of claim 1, wherein the magnetic tunnel junction has a storage magnetization direction, and, during the write operation, the strap is configured to apply the second heating current through the strap to induce a write magnetic field, such that the storage magnetization direction is switched according to the write magnetic field.

11. A memory device comprising:
at least one magnetic random access memory (MRAM) cell including a magnetic tunnel junction having a first end and a second end; and
a strap electrically coupled to the second end of the magnetic tunnel junction; and
a bit line electrically coupled to the first end of the magnetic tunnel junction,
wherein, during a write operation, the bit line is configured to apply a first heating current through the magnetic tunnel junction, and the strap is configured to apply a second heating current through the strap, such that the magnetic tunnel junction is heated to at least a threshold temperature according to the first heating current and the second heating current; and
wherein the magnetic tunnel junction includes:
a sense layer having a sense magnetization direction;
a storage layer having a storage magnetization direction;
a spacer layer disposed between the sense layer and the storage layer; and
a pinning layer adjacent to the storage layer and configured to stabilize the storage magnetization direction relative to the threshold temperature,
wherein, during the write operation, the storage magnetization direction is switchable between multiple directions to store data, and
wherein, during a read operation, the sense magnetization direction is varied, relative to the storage magnetization direction, to determine the data stored by the storage layer.

12. The memory device of claim 11, further comprising a field line magnetically coupled to the magnetic tunnel junction, wherein, during the read operation, the field line is configured to apply a read current through the field line to induce a read magnetic field, such that the sense magnetization direction is varied according to the read magnetic field.

13. The memory device of claim 11, wherein, during the read operation, the strap is configured to apply a read current through the strap to induce a read magnetic field, such that the sense magnetization direction is varied according to the read magnetic field.

14. The memory device of claim 11, wherein, during the read operation, the bit line is configured to apply a sense current through the magnetic tunnel junction to determine a resistance of the magnetic tunnel junction, and the resistance is indicative of a degree of alignment between the sense magnetization direction and the storage magnetization direction.

15. The memory device of claim 14, wherein, during the read operation, the sense magnetization direction is varied to determine a minimum of the resistance.

16. A method of operating a memory device, comprising:
provide a magnetic tunnel junction and a strap electrically coupled to the magnetic tunnel junction, wherein the magnetic tunnel junction has a storage magnetization direction that is pinned relative to a threshold temperature; and during a write operation,
heating the magnetic tunnel junction to at least the threshold temperature such that the storage magnetization direction is temporarily unpinned, wherein heating the magnetic tunnel junction includes applying a first heating current through the magnetic tunnel junction and applying a second heating current through the strap; and inducing a write magnetic field such that the storage magnetization direction is aligned according to the write magnetic field;

wherein the threshold temperature corresponds to $T_{BS}$, and applying the second heating current through the strap generates sufficient heat to raise a temperature of the magnetic tunnel junction to at least $0.6 \times T_{BS}$ but less than $T_{BS}$.

17. The method of claim 16, wherein the first heating current and the second heating current merge to form a combined heating current that passes through at least a portion of the strap, and a magnitude of the second heating current is at least 50 percent but less than 100 percent of a magnitude of the combined heating current.

18. The method of claim 16, wherein inducing the write magnetic field is carried out by applying the second heating current through the strap.

* * * * *